(12) United States Patent
Ramu et al.

(10) Patent No.: US 10,784,382 B2
(45) Date of Patent: Sep. 22, 2020

(54) ISOLATION PIN DIODE STRUCTURE

(71) Applicant: DUET MICROELECTRONICS INC., Raritan, NJ (US)

(72) Inventors: Ashok T. Ramu, Raritan, NJ (US); Robert J. Bayruns, Raritan, NJ (US); Michel Francois, Raritan, NJ (US)

( * ) Notice: Subject to any disclaimer, the term of this patent is extended or adjusted under 35 U.S.C. 154(b) by 0 days.

(21) Appl. No.: 16/101,938

(22) Filed: Aug. 13, 2018

(65) Prior Publication Data
US 2019/0109242 A1 Apr. 11, 2019

Related U.S. Application Data

(60) Provisional application No. 62/570,695, filed on Oct. 11, 2017.

(51) Int. Cl.
*H01L 29/868* (2006.01)
*H01L 29/40* (2006.01)
*H01L 29/417* (2006.01)
*H01L 29/06* (2006.01)

(52) U.S. Cl.
CPC ........ *H01L 29/868* (2013.01); *H01L 29/0619* (2013.01); *H01L 29/0692* (2013.01); *H01L 29/402* (2013.01); *H01L 29/404* (2013.01); *H01L 29/417* (2013.01)

(58) Field of Classification Search
CPC .............. H01L 29/868; H01L 29/8611; H01L 29/8613; H01L 29/0619; H01L 29/402; H01L 29/404; H01L 29/405; H01L 29/0607; H01L 29/41; H01L 29/417
USPC ......................................... 257/656, E29.013
See application file for complete search history.

(56) References Cited

U.S. PATENT DOCUMENTS

| | | | | |
|---|---|---|---|---|
| 10,056,364 | B1* | 8/2018 | Klebanov | H01L 29/402 |
| 2007/0072332 | A1* | 3/2007 | Kemmer | H01L 27/14603 438/56 |
| 2010/0289110 | A1* | 11/2010 | Tarui | H01L 29/0619 257/490 |
| 2013/0124905 | A1* | 5/2013 | Chen | G11C 7/08 713/500 |
| 2014/0210037 | A1* | 7/2014 | Momota | H01L 29/402 257/484 |

(Continued)

*Primary Examiner* — Mohammed Shamsuzzaman
*Assistant Examiner* — Aaron J Gray
(74) *Attorney, Agent, or Firm* — John H. Choi & Associates

(57) ABSTRACT

A PIN diode has an anode spaced away from a central region of a top surface of a substrate, such that the anode is in a corner or at a side edge of the top surface. Alternatively, the PIN diode has an anode surrounded by a shield layer. The PIN diode reduces unwanted parasitic capacitance to increase the reverse isolation of RF switches and to reduce the diffusion capacitance to increase the $f_{3dB}$ frequency specification of amplifier circuits. The PIN diode dramatically reduces the values of both parasitic and diffusion capacitances, which enables its application in switches and amplifiers under a wide variety of bias conditions including reverse, low-moderate forward, and large forward-bias; which enables bonding to a much larger metal area than the active electrode, with negligible increase in the parasitic capacitance; and which enables reliable wire-bonding by presenting a highly planar metal surface.

16 Claims, 14 Drawing Sheets

(56) References Cited

U.S. PATENT DOCUMENTS

2014/0284754 A1* 9/2014 Yamamoto .......... H01L 23/5223
                                                                257/487

* cited by examiner

ISOLATION PIN DIODE STRUCTURE

CROSS-REFERENCE TO RELATED APPLICATION

This application claims priority to U.S. Provisional Application No. 62/570,695, filed on Oct. 11, 2017, which is incorporated by reference in its entirety.

FIELD OF THE INVENTION

The present invention relates to semiconductor diodes, more specifically to high isolation p-type/intrinsic/n-type (PIN) diodes used as attenuators and switches.

BACKGROUND OF THE INVENTION

The p-type/intrinsic/n-type (PIN) diode can be used as a tunable resistor element in certain amplifier circuits. The diode's parasitic capacitance, $C_{par}$, across a feedback resistor produces a time constant and rolls off the gain of the amplifier. The $f_{3dB}$ bandwidth is an important specification for high-frequency amplifiers and depends inversely on the ratio of the parasitic capacitance to the tunable conductance, G, of the PIN diode. Sidewalls of non-planar diodes are important sources of unwanted current leakage, and surface electronic states along the sidewalls are important sources of additional parasitic capacitance at high frequencies. The PIN diode's diffusion capacitance, $C_{diff}$, is another characteristic that further deteriorates $f_{3dB}$.

The PIN diode is also used as a radio frequency (RF) switch. The parasitic capacitance across the PIN diode is an issue that causes poor reverse isolation. That is, when the diode is turned off, a signal current can still leak through the capacitor, instead of isolating the output to high-frequency alternating current (AC) signals.

In forward-biased operation, when a current is applied into the anode of a PIN diode, holes, i.e., vacancies of electrons that behave for all practical purposes like free positive charges, are injected from the p++ region, where they are in abundance, into the intrinsic region. Some holes recombine within the intrinsic region with electrons injected from the cathode. The rest, upon reaching the other end of the intrinsic region, diffuse into the n++ region, most of them recombining with the abundance of electrons present there, with a small balance drawn away by the cathode. Electrons injected from the cathode into the intrinsic region follow a similar path in reverse, interacting with holes traveling in the opposite direction in an analogous way.

In reverse-biased operation, when current is pulled away from the anode, only small minorities of electrons and holes are available to contribute to the current without creating electric fields large enough to potentially damage the device.

The PIN diode has excellent isolation, i.e., resistance to reverse-biased operation. It surpasses the PN diode, due to the resistance offered by the nearly insulating intrinsic region. The PIN diode nevertheless displays reasonable conductance when forward-biased, especially when responding to small time-varying currents such as alternating current (AC) superimposed on a large constant forward-bias current (direct current or DC). This conductance to AC signals can be tuned by varying the DC bias current. Furthermore, in forward-biased operation, the intrinsic region stores large quantities of charge in the form of electrons and holes. This reservoir of charge screens the voltage response to large, high-frequency AC currents superimposed on the even larger DC bias current, resulting in a highly linear current-to-voltage signal conversion. The large reverse isolation and the linear, tunable forward conductance have resulted in the PIN diode's deployment in RF switches and RF linear amplifiers.

However, the isolation of a reverse-biased PIN diode is limited at high frequencies by the parasitic capacitance across its terminals. This allows a power source to push current into the cathode and temporarily build up charge on the metal surface, which in turn electrostatically attracts an equal and opposite charge onto the anode from the other terminal of the power source, thus completing the circuit.

It is not the reverse-biased diode alone that suffers from parasitic capacitive effects. At moderate forward-bias levels and AC signals at high frequencies used, for instance, in photodiode amplifiers, the dominant capacitive contribution is the parasitic capacitance between the device terminals as described above. Another important contribution present only in forward-bias operation is from the charging and discharging of traps, i.e., defect centers present along every exposed surface that can capture or release electrons and holes. The capacitive contribution of the trapped charge depends upon the AC signal frequency, electron and hole concentrations and velocities, whether the traps are already occupied, the effective size of the traps, and their characteristic capture and emission lifetimes (i.e. how fast they can charge and discharge). Large parasitic capacitance values due to these effects limit the bandwidth of the amplifier by rolling off the amplifier gain at a lower frequency.

Under higher forward-bias levels, the PIN diode capacitance is dominated by the diffusion capacitance due to storage of carriers in the intrinsic material. The physical origin of this capacitance is entirely different from the parasitic capacitance discussed above. The former is related to diffusive transport and is observed not only in the context of electrically charged particles, but also, for instance, in diffusive heat transfer by waves of charge-neutral atomic displacement ("phonons"). The parasitic capacitance is physically due to the electrostatic pull of a positive charge on the electron gas comprising a metal.

Diffusion capacitance, being inherent to device operation, is not technically parasitic, although in practice, its effects on amplifier circuit characteristics are indistinguishable from the parasitic capacitance. Its inevitability makes it much harder to reduce the diffusion capacitance without negatively affecting conductance.

Therefore, a need exists for a PIN diode with reduced capacitance.

SUMMARY OF THE INVENTION

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

In a first embodiment, the present invention is a PIN diode comprising: a substrate having a top surface, the top surface having a central area; and an anode on the top surface and spaced away from the central area, thereby reducing a static capacitance of the PIN diode. The top surface has a corner area; and wherein the anode is disposed in the corner area. Alternatively, the top surface has a side edge and an area adjacent to the side; and wherein the anode is disposed in the area adjacent to the side edge. The top surface has a substantially rectangular shape, or a substantially circular shape.

In a second embodiment, the present invention is a PIN diode comprising: a plurality of terminals including a first terminal, a second terminal, and at least one third terminal, with the first terminal acting as an anode, and the second terminal acting as a cathode; a substrate having a top surface and connected to the plurality of terminals, wherein the at least one third terminal forms an electrostatic shield, thereby reducing fringing capacitance between the anode and the cathode. The top surface has a central area; and wherein the anode is disposed in the central area. Alternatively, the top surface has a corner area; and wherein the anode is disposed in the corner area. In a further alternative embodiment, the top surface has a side edge and an area adjacent to the side; and wherein the anode is disposed in the area adjacent to the side edge. The top surface has a substantially rectangular shape. The top surface has a central area; and wherein the anode is disposed in the central area. Alternatively, the top surface has a corner area; and wherein the anode is disposed in the corner area. In a further alternative embodiment, the top surface has a side edge and an area adjacent to the side; and wherein the anode is disposed in the area adjacent to the side edge. In another alternative embodiment, the top surface has a substantially circular shape. The top surface has a central area; and wherein the anode is disposed in the central area. Alternatively, the top surface has a corner area; and wherein the anode is disposed in the corner area. In a further alternative embodiment, the top surface has a side edge and an area adjacent to the side; and wherein the anode is disposed in the area adjacent to the side edge.

In a third embodiment, the present invention is a PIN diode comprising: a first terminal acting as an anode; a second terminal acting as a cathode; at least one third terminal; a substrate having a top surface; and an insulating layer disposed between top surface of the substrate and the at least one third terminal; wherein the at least one third terminal forms an electrostatic shield to reduce fringing capacitance between the anode and the cathode. The insulating layer is composed of $SiO_2$. The third terminal includes a layer implanted with one of a P+ implant or a P− implant, and the insulating layer is composed of $SiO_2$. The at least one third terminal is connected to an impedance which is connected to a ground, thereby reducing feedthrough for a low current state or an OFF state. The ground is one of an alternating current (AC) ground or a direct current (DC) ground. The impedance is connected to the ground through a switch, thereby allowing high isolation in the OFF state, and providing relatively small capacitance between the anode and the at least one third terminal.

The present invention is for a PIN diode that reduces unwanted parasitic capacitance to improve the reverse isolation of RF switches and to reduce the diffusion capacitance to increase the $f_{3dB}$ frequency specification of amplifier circuits. The advantages to the present invention are numerous. It dramatically reduces the values of both parasitic and diffusion capacitances. This enables its application in switches and amplifiers under a wide variety of bias conditions including reverse, low-moderate forward, and large forward-bias. It enables bonding to a much larger metal area than the active electrode, with negligible increase in the parasitic capacitance. It enables reliable wire-bonding by presenting a highly planar metal surface.

BRIEF DESCRIPTION OF THE SEVERAL VIEWS OF DRAWINGS

The foregoing summary, as well as the following detailed description of presently preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

Figure 13A:
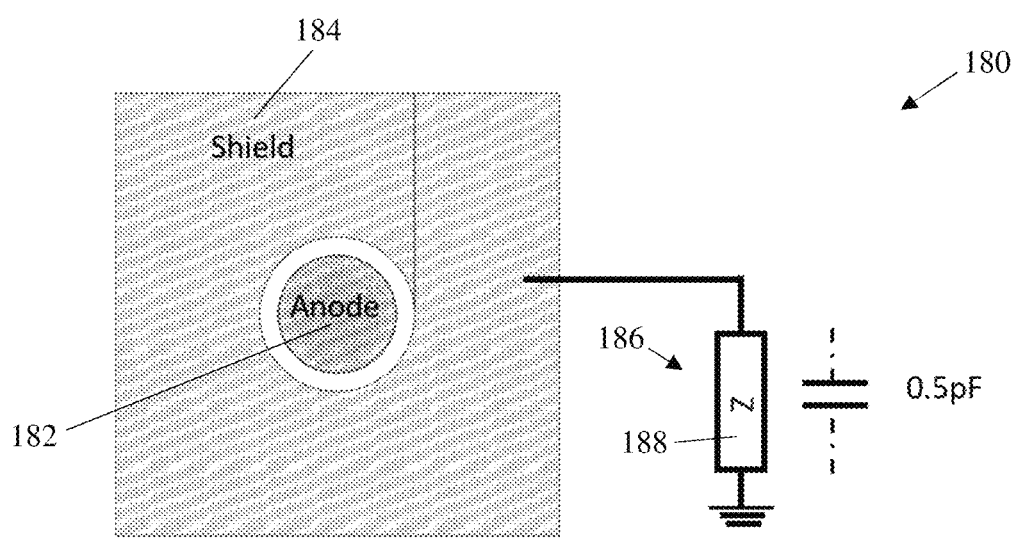
FIG. 13A is a circuit diagram of another embodiment of the present invention used for reducing the impact of the large shield capacitance at high DC currents and low frequencies.
Figure 13B:
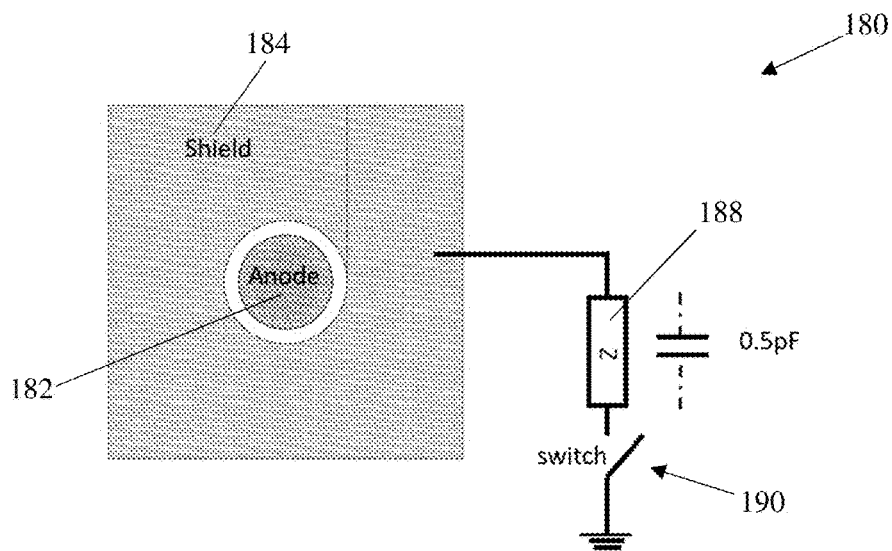

FIG. 13B uses a switch to unload the impedance Z from the shield.

Figure 14:
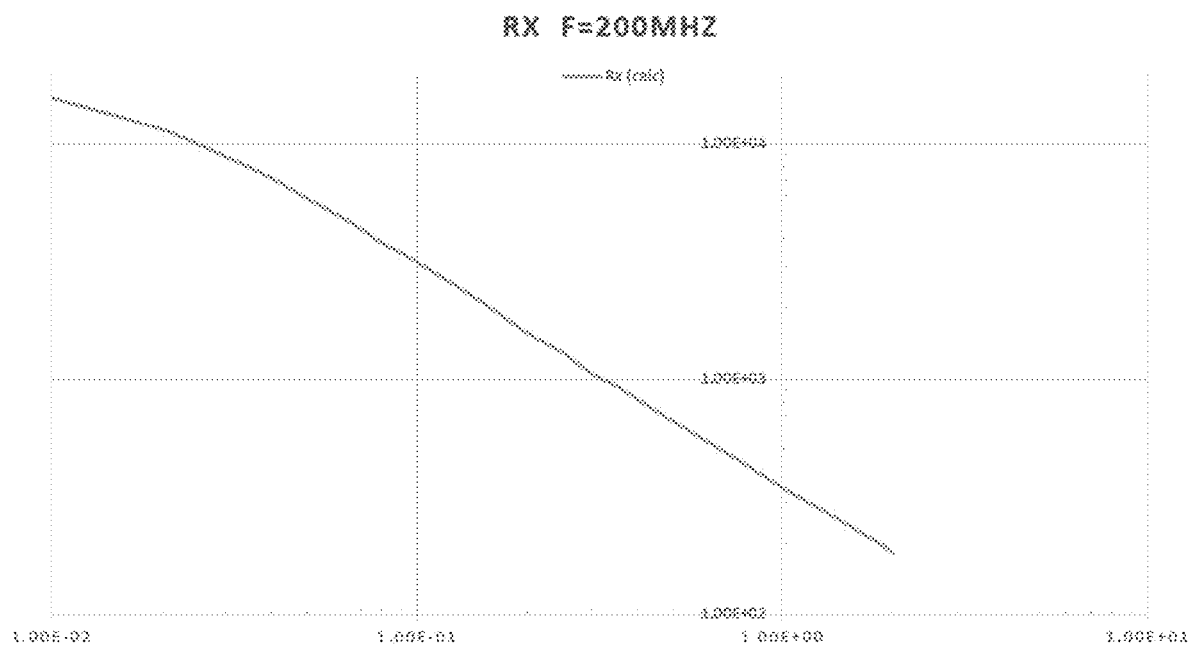

FIG. 14 shows a measurement of the AC resistance (RX) vs. DC current of the present invention reduced to practice.

Figure 15:
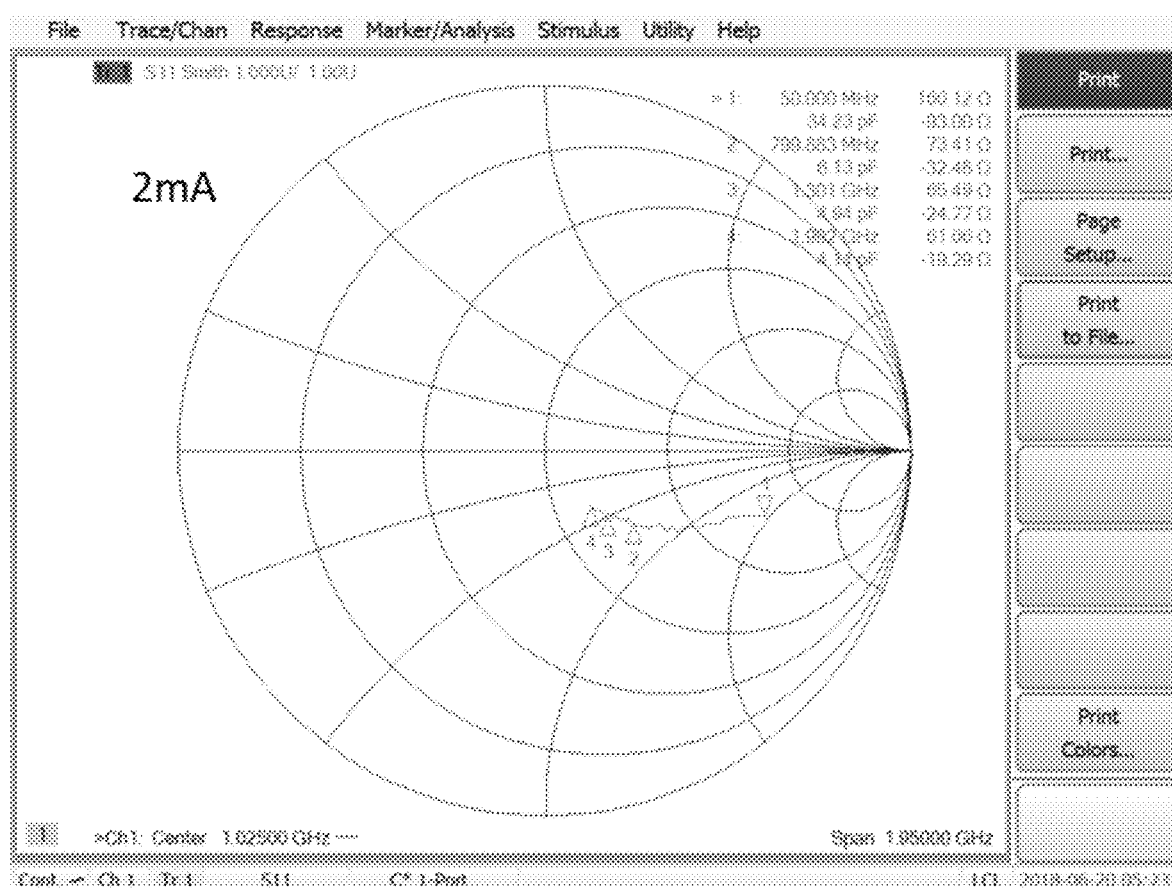

FIG. 15 is a measurement of anode to shield impedance (S11) with the PIN diode biased to a current of 2 mA.

Figure 16A:
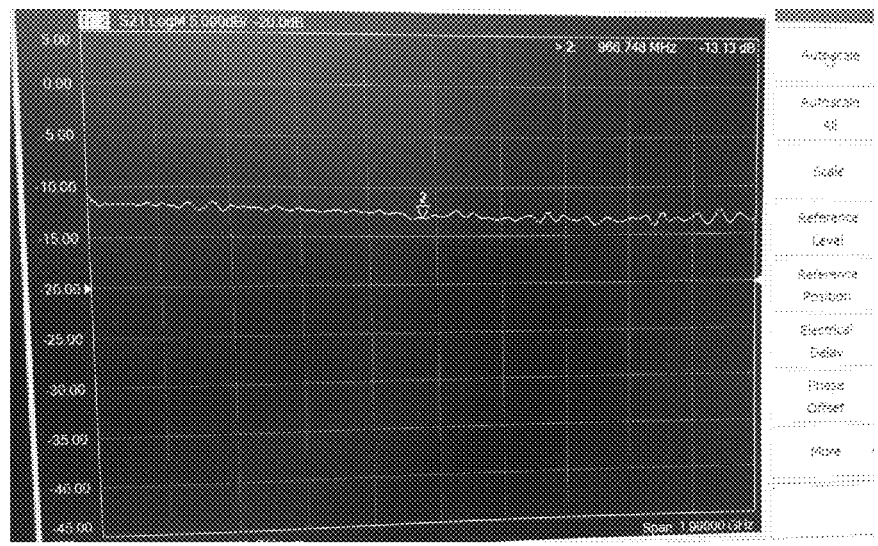

FIG. 16A is a through-loss measurement in a 50 ohm system with a DC bias current of 1 mA and shield floating.

Figure 16B:
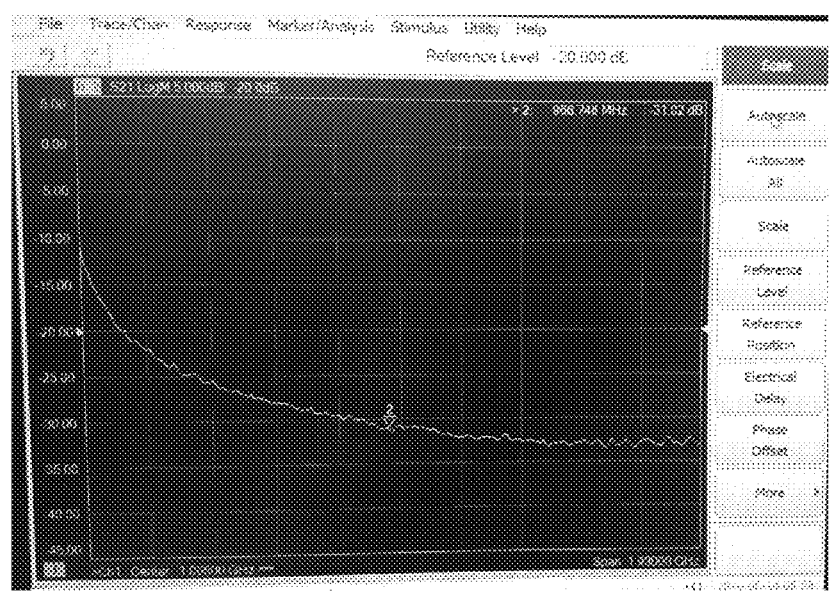

FIG. 16B shows the deleterious effect of grounding the shield directly.

Figure 17:
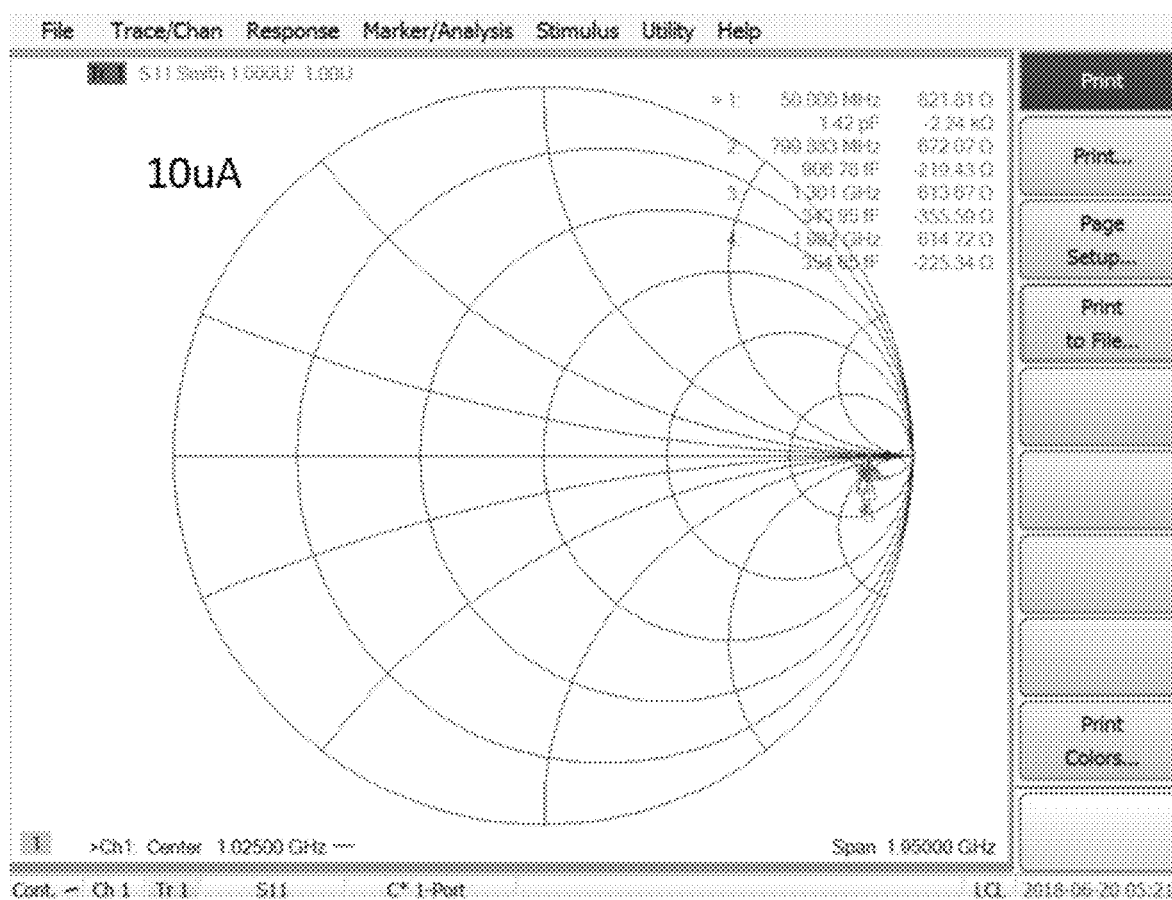

FIG. 17 is a measurement of anode-to-shield impedance (S11) with the PIN diode biased to a current of 10 µA.

Figure 18:
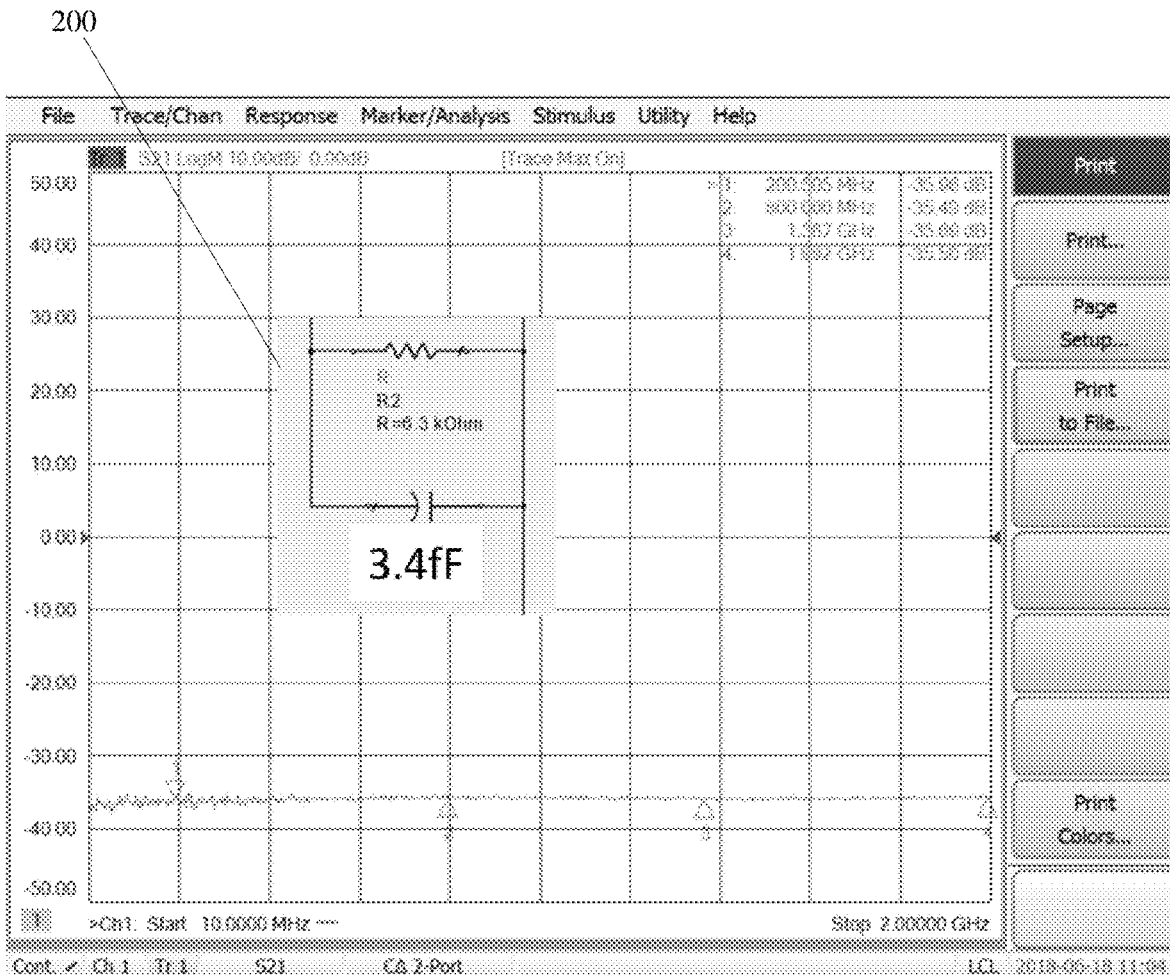

FIG. 18 shows a through-loss measurement of the center anode PIN diode with shield at a DC current of 40 µA.

Figure 19:
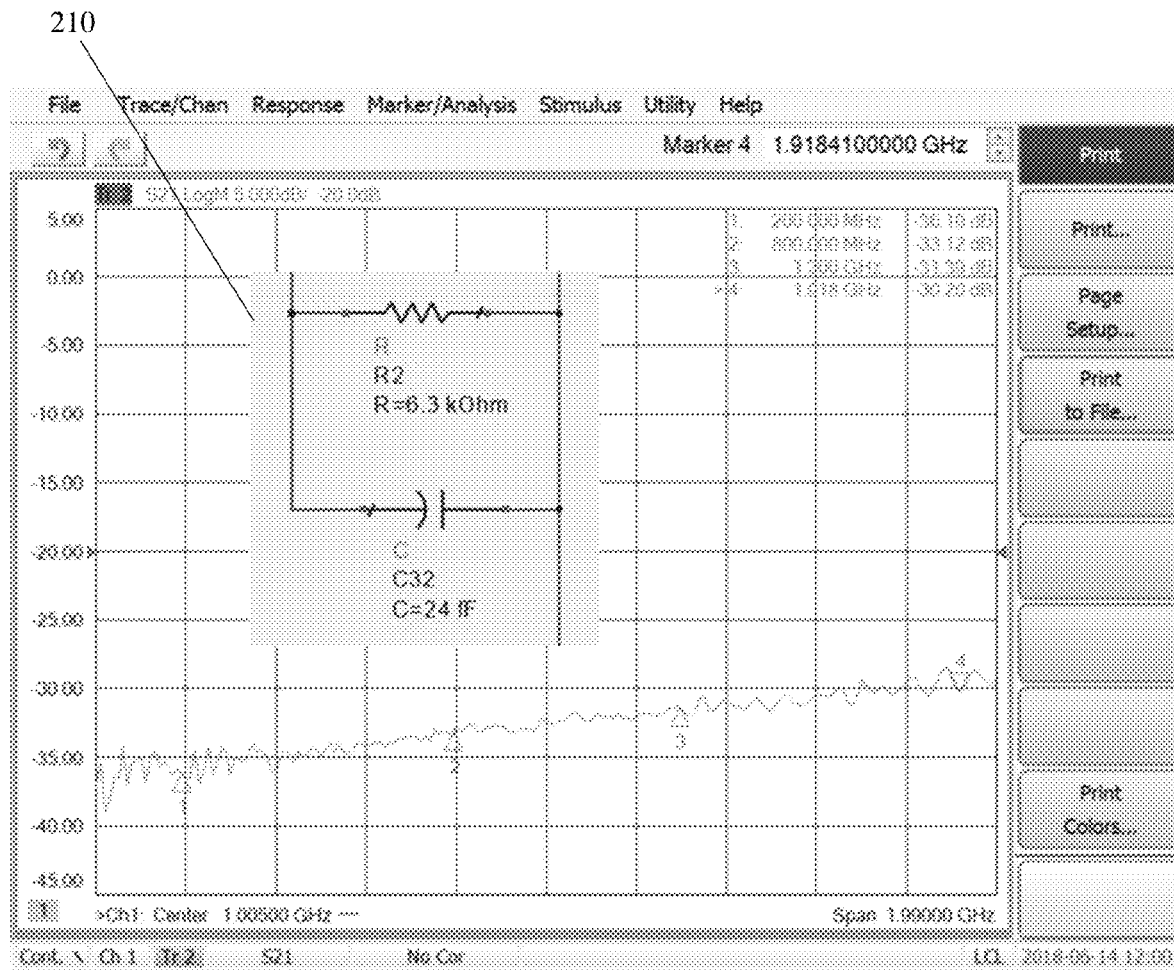

FIG. 19 shows a through-loss measurement of the center anode PIN diode in the prior art without a shield at a DC current of 40 µA, displaying significantly larger feedthrough compared to the present invention.

To facilitate an understanding of the invention, identical reference numerals have been used, when appropriate, to designate the same or similar elements that are common to the figures. Further, unless stated otherwise, the features shown in the figures are not drawn to scale, but are shown for illustrative purposes only.

DETAILED DESCRIPTION OF THE INVENTION

Certain terminology is used in the following description for convenience only and is not limiting. The article "a" is intended to include one or more items, and where only one item is intended the term "one" or similar language is used. Additionally, to assist in the description of the present invention, words such as top, bottom, side, upper, lower, front, rear, inner, outer, right and left are used to describe the accompanying figures. The terminology includes the words above specifically mentioned, derivatives thereof, and words of similar import.

Figure 1:
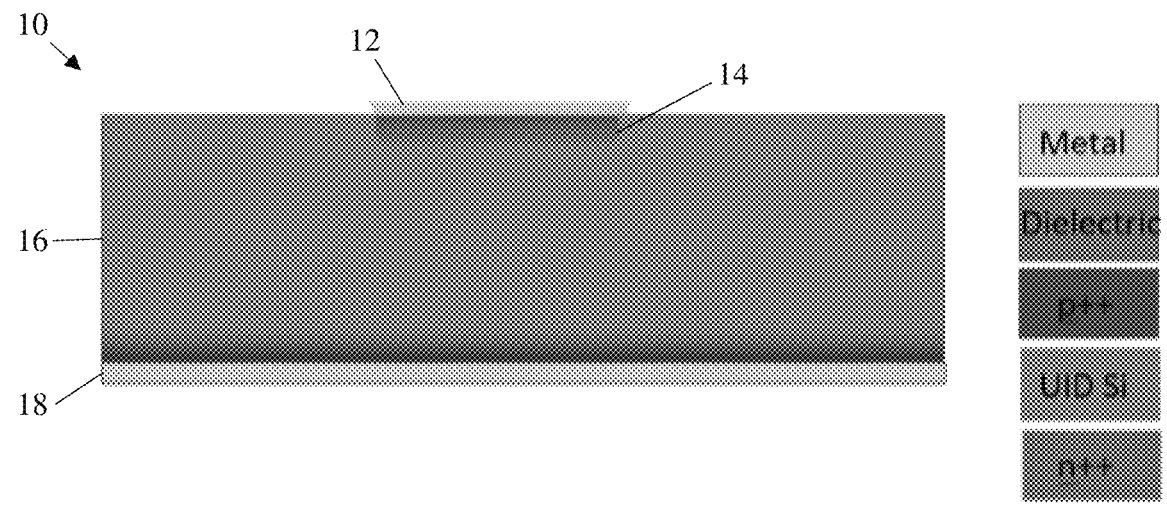
FIG. 1 is a cross-sectional illustration of a PIN diode in the prior art.

Referring to FIG. 1, a typical silicon PIN diode 10 in the prior art is shown which used for an RF switch or a linear resistor with cylindrical symmetry about the central vertical axis. A metal layer 12 is formed on a p++ layer 14, which in turn is formed on an unintentionally doped (UID) layer 16 of silicon (Si), forming a substrate. The UID layer 16 is formed on another metal layer 18, with the metal layers 12, 18 acting as electrodes, namely an anode and a cathode, respectively. A common requirement for these applications is the reduction of parasitic capacitance. The parasitic capacitance is very high in the PIN diode 10 of FIG. 1 due to the large dielectric constant of silicon, measuring about 11.8, between the two electrodes 12, 18.

Figure 2:
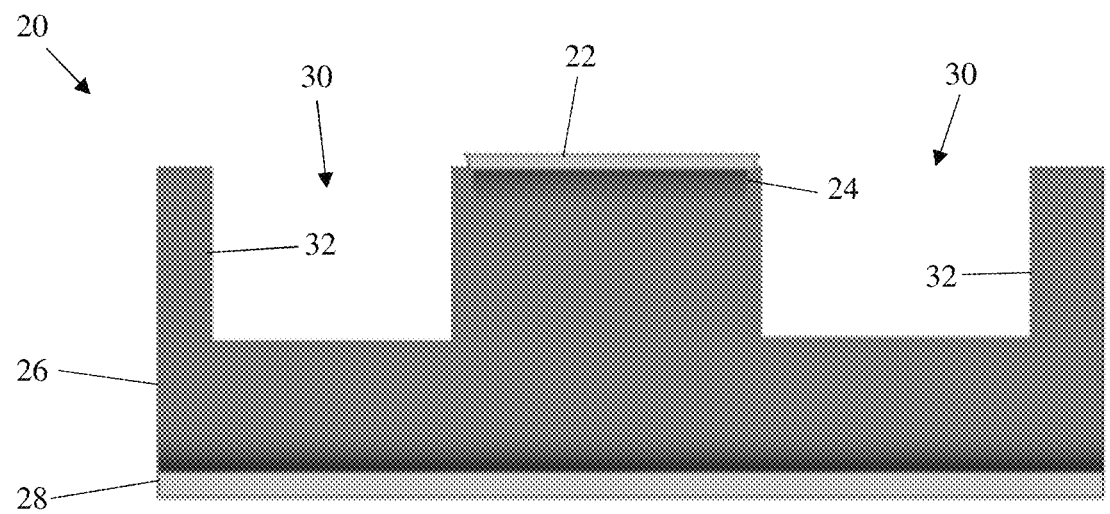
FIG. 2 is a cross-sectional illustration of another PIN diode in the prior art.

FIG. 2 shows a PIN diode 20 in the prior art having a metal layer 22 on a p++ layer 24, which in turn is formed on a UID layer 26 of silicon, with a metal layer 28 beneath the UID layer 26. At least one trench 30 is etched around the metal electrode 22 and containing air, having a dielectric constant of about 1, which reduces the parasitic capacitance considerably.

However, there are several disadvantages to the prior art PIN diode 20 of FIG. 2. First, the reduction in parasitic capacitance comes at the expense of an increase in electrical resistance due to the restriction of current flow to within the pedestal beneath the electrode 22. Second, there is a lower limit to the size of the metal contact size that is set by the requirement of wire-bonding to the external electrical lead. The nominal minimum contact area is about 10,000 square microns, though about 3,600 square microns is achievable with modern wire-bonding technologies. Therefore, it is not possible to reduce the capacitance by further reducing the contact size. The third and most important demerit of the prior art PIN diode 20 of FIG. 2 is the proximity of the trench sidewalls 32 to the p++ region 32, where charge carriers are highly concentrated, and to the conduction path, leading to large sidewall surface leakage currents as well as trapping/detrapping of surface electronic states leading to degraded high-frequency performance.

Figure 3:
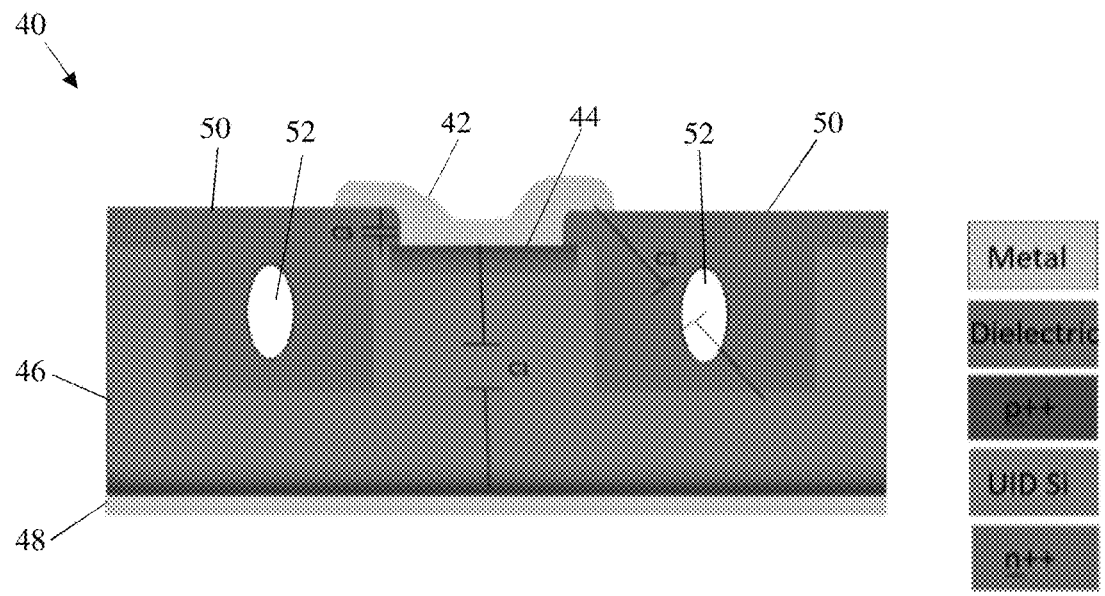
FIG. 3 is a cross-sectional illustration of a modified PIN diode in the prior art.

FIG. 3 shows a PIN diode 40 in the prior art that attempts to ameliorate the capacitance while maintaining a large enough bond-metal area. A metal layer 42 is formed on a p++ layer 44, which in turn is formed on a UID layer 46 of silicon, with a metal layer 48 beneath the UID layer 46. At least one trench is etched around the metal electrode 42, with the at least one trench being filled with a dielectric 50, such as silicon dioxide with a dielectric constant of about 3.9 and having an optional air cavity 52. The extra bonding metal is supported by the dielectric bump created on the silicon surface.

The prior art PIN diode 40 of FIG. 3 has at least four drawbacks. First, the capacitance, C2, is adversely impacted by the fact that the common filler dielectrics 50 have high dielectric constants ranging from about 2.5 to about 3.5, compared to air, which has a dielectric constant of about 1. Second, the air cavity 52 has an impact limited by the thickness of the dielectric bump used to reduce C2. That is, a thicker dielectric bump reduces the fraction of the trench that comprises the air cavity 52. Third, a tall bump causes the metal 42 to be highly non-planar making reliable wire-bonding to such non-planar structures very challenging. Finally and most importantly, the sidewalls of the trench remain adjacent to the conduction path and the regions of the high carrier concentration, causing leakage and surface-state induced degradation of high-frequency performance just as in the prior art PIN diode 20 of FIG. 2.

Figure 4:
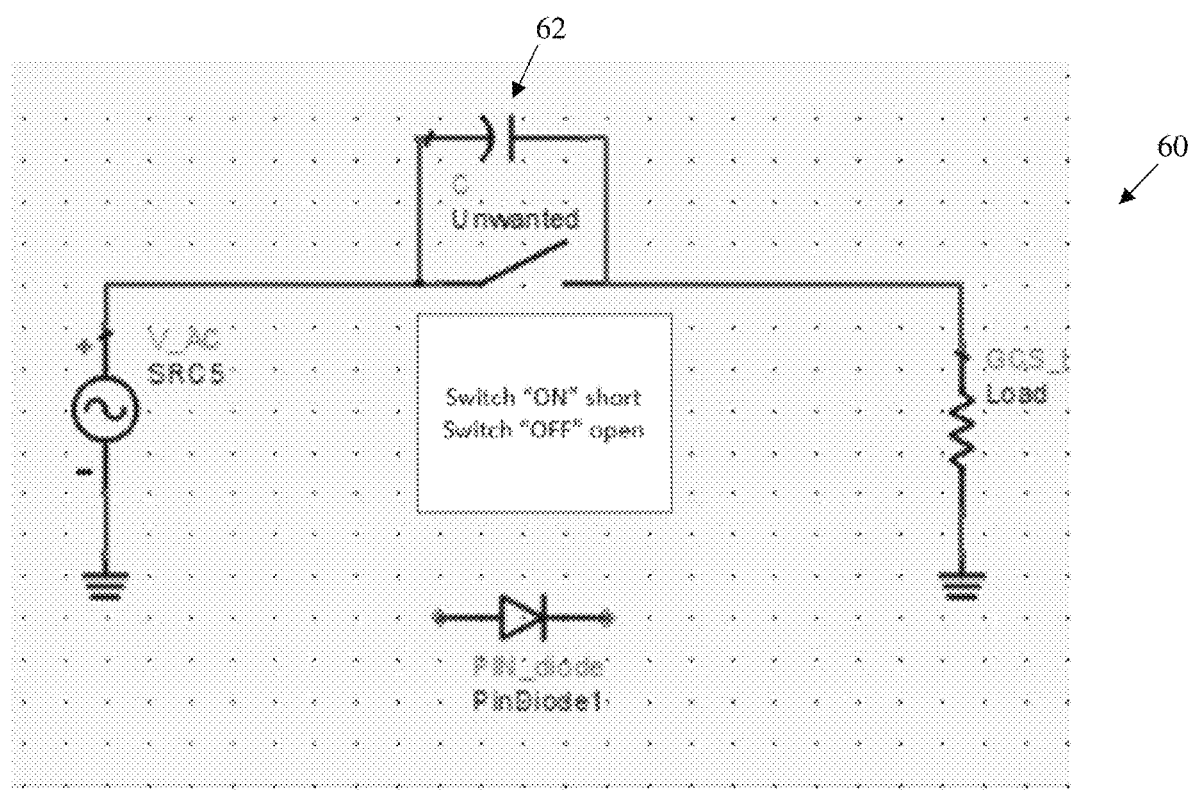
FIG. 4 represents the unwanted anode-to-cathode capacitance in a diode in the prior art connected in a switch configuration.

Referring to FIG. 4, PIN diodes in the prior art are used in circuits 60 having various applications, such as RF and microwave switches and in attenuator applications as non-linear devices and as linear RF resistors. For use of the PIN diode as a switch, it is important to have a low "on" resistance to transmit a signal and to have good reverse isolation in the "off" state. The parasitic capacitance 62 of the PIN diode, "C Unwanted," will leak the signal into the load resistor, defeating the purpose of a switch. Thus, the PIN diodes of the present invention solve this problem.

Figure 5:
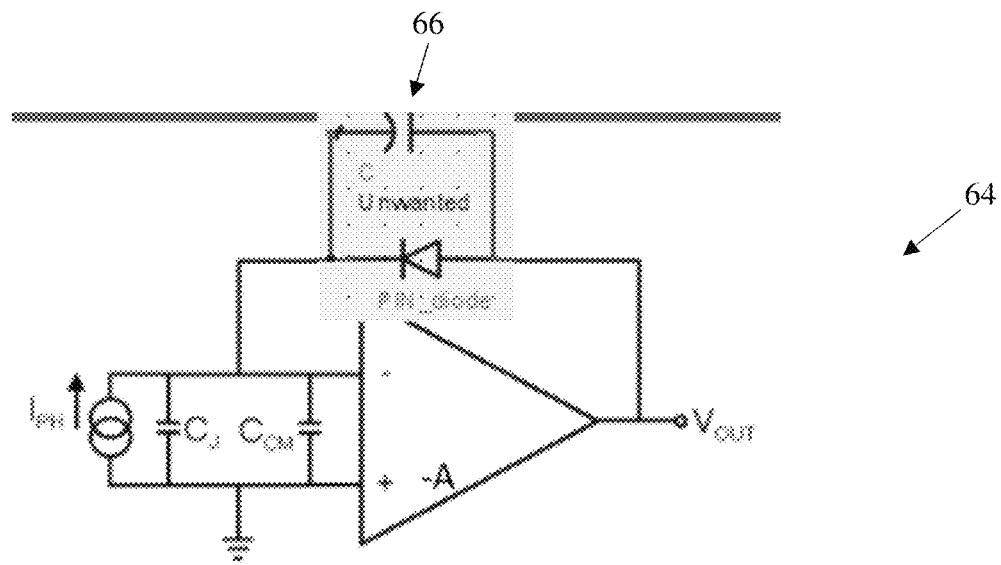
FIG. 5 represents the unwanted anode-to-cathode capacitance in a diode in the prior art connected as a variable resistor in a transimpedance amplifier.

Referring to FIG. 5, using PIN diodes in the prior art such as in circuits 64 such as a feedback transimpedance amplifier, the parasitic and diffusion capacitances 66 across the PIN diode, "C Unwanted," will limit the bandwidth of the amplifier. Again, the PIN diodes of the present invention solve this problem.

Figure 6A:
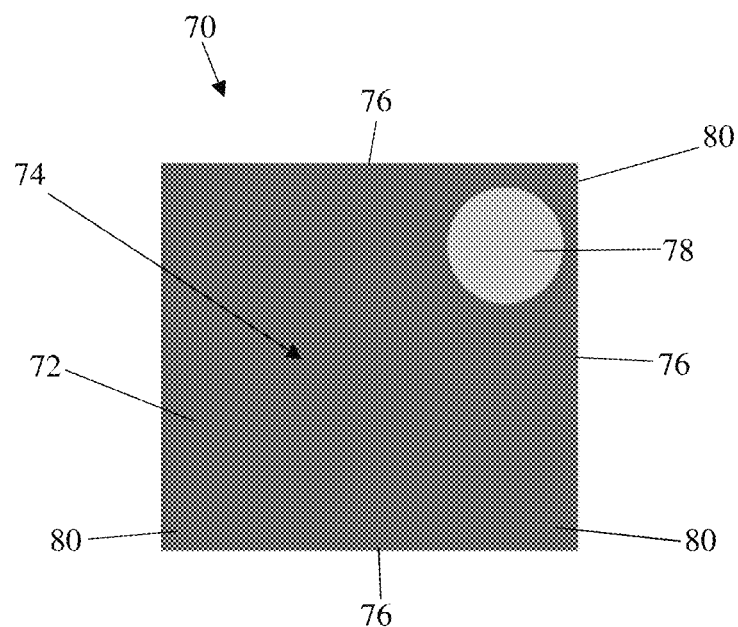
FIG. 6A represents the present invention reducing an anode-to-cathode capacitance by moving the anode to the very corner of the PIN diode.
Figure 6B:
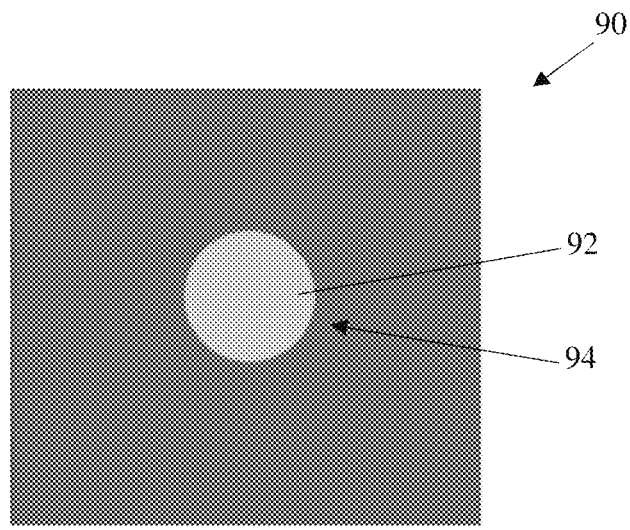
FIG. 6B represents a prior art layout of a diode.

Reference is now made to FIGS. 6A-6B. FIG. 6A shows an embodiment of the present invention with a PIN diode 70 with a die forming the UID layer of the PIN diode and having a top surface 72 with a central area 74, side edges 76, and corners 78, and having the anode 80 placed at an edge 76 of the die to reduce the fringing capacitance. The top surface 72 may have any known shape, such as a substantially square or rectangular shape, or a substantially circular shape.

In a preferred embodiment, the anode 78 placed in the corner 80 of the die, such that the PIN diode 70 in FIG. 6A has a simulated capacitance of about 4.7 fF. On the contrary, the prior art PIN diode 90 with the anode 92 in a central area 94 of the die, shown schematically in FIG. 6B, has a simulated capacitance of about 6.1 fF. The reason for the reduction in parasitic capacitance in the PIN diode 70 of the present invention, shown in FIG. 6A, is that at the device corners 80, the relative dielectric constant outside of the Si is usually less that the dielectric constant Er=11.8 value of Si. An example would be that of air, having a dielectric constant Er=1, or plastic encapsulation, having a dielectric constant Er=4. The AC resistance of the PIN diode 70 depends more on the diffusion properties of the minority carriers and is less affected with the corner anode 78 as in the PIN diode 70 in FIG. 6A. In alternative embodiments, the anode 78 may also be placed near an edge 76 instead of at the corner 80 for more isolation from surface states at the edges 76 of the die. The anode 78 need not be circular as shown in FIG. 6A, as many shapes are possible, such as elliptical/oval, triangular, square, and rectangular shapes.

Figure 7:
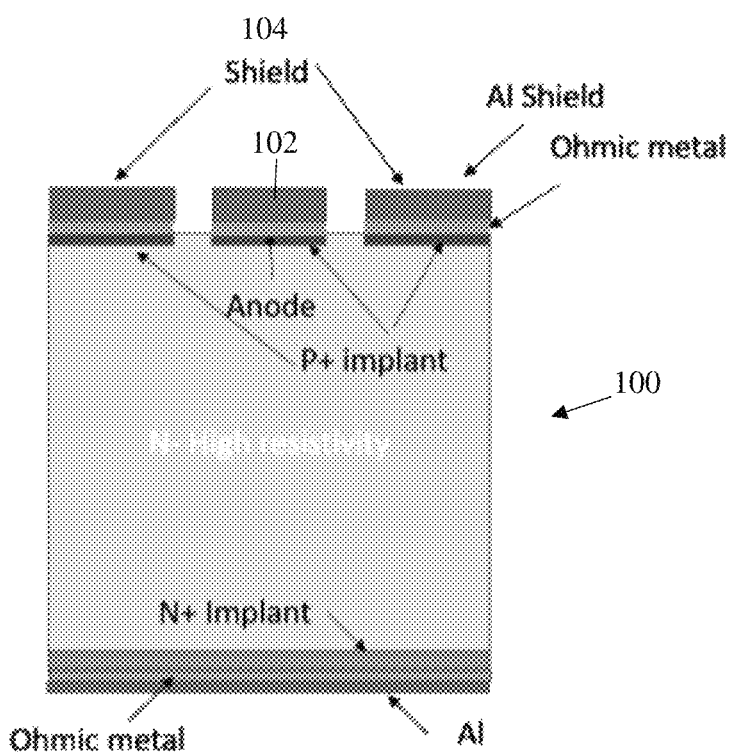
FIG. 7 is a cross-sectional illustration of the preferred PIN diode shield of the present invention with a metal shield over P+.
Figure 8:
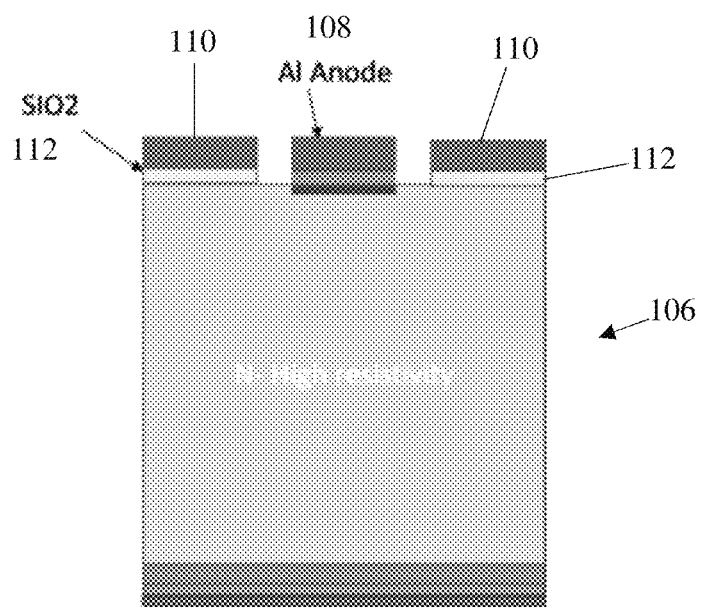
FIG. 8 is a cross-sectional illustration of the preferred PIN diode shield of the present invention with a metal shield over an insulator, in this case $SiO_2$.

FIGS. 7-8 show alternative embodiments of the PIN diode 100 of the present invention with the anode 102 surrounded by at least one shield 104. In the example embodiment shown in FIG. 7, the shield 104 comprises a p+ implant bottom layer, an ohmic metal middle layer, and an aluminum top layer. Alternatively, the shield comprises a p– implant bottom layer, an ohmic metal middle layer, and an aluminum top layer. In another alternative embodiment, as shown in FIG. 8, the shielded diode 106 had an anode 108 surrounded by a shield 110 on top of a silicon dioxide layer 112. In an example embodiment, the anode 108 is composed of aluminum (Al).

Figure 9:
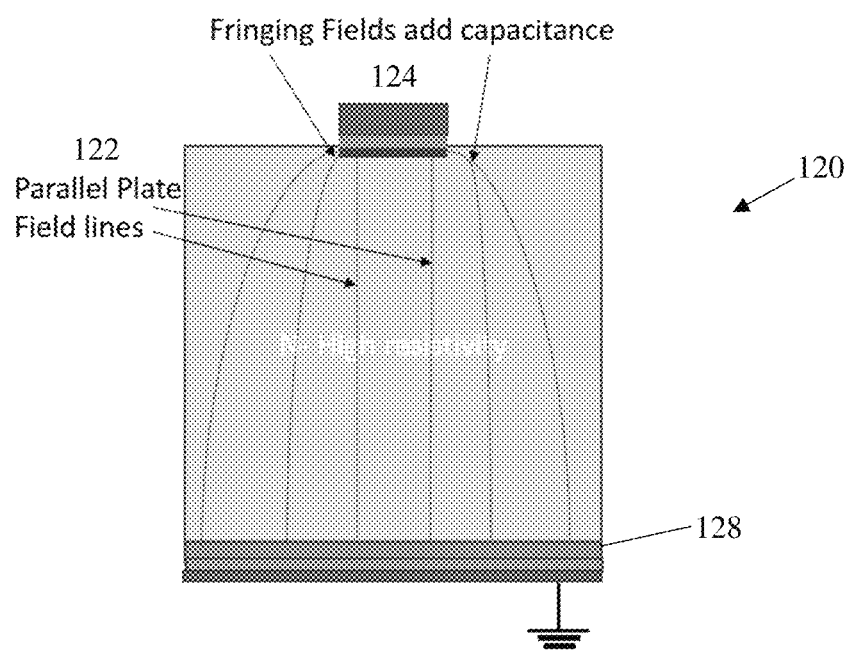
FIG. 9 is a cross-sectional illustration of the static electric field from anode to cathode with no DC current flow.
Figure 10:
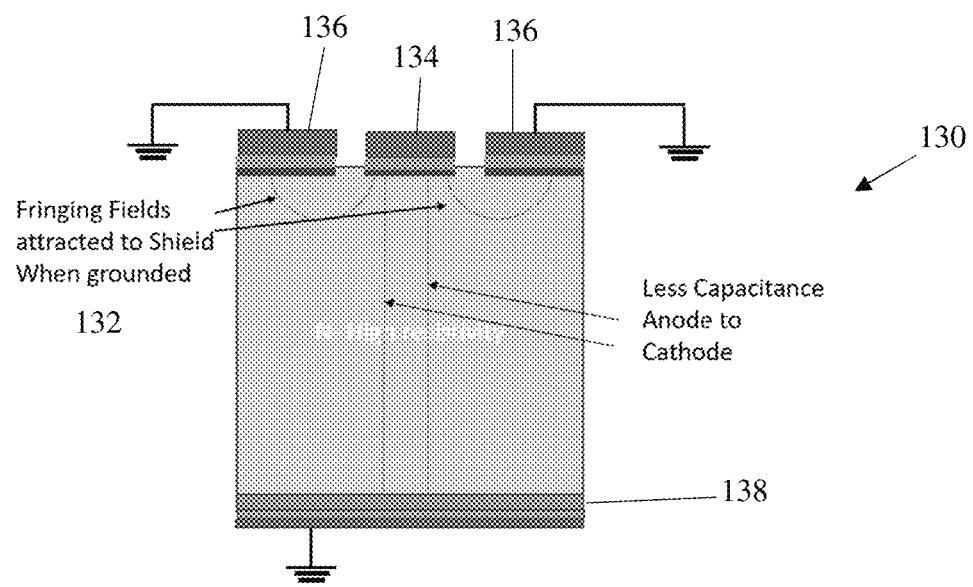
FIG. 10 is a cross-sectional illustration of the static electric field from anode to cathode of the present invention with no DC current flow, showing the reduced anode-to-cathode capacitance.

FIGS. 9 and 10 demonstrate the effects of a shield when used in PIN diodes 120, 130, respectively, having anodes 124, 134, and cathodes 128, 138, respectively. This representation assumes very little or no DC current flow and illustrates the field lines 122, 132 for the electrostatic capacitances. Comparing a PIN diode 120 without a shield as shown in FIG. 9 and a shielded PIN diode 130 as shown in FIG. 10 with shields 136, it can be seen that when the shield 136 is grounded, as shown in FIG. 10, the shield 136 attracts fringing fields 132, allowing only the parallel plate field lines to the cathode 138, and therefore less capacitance from anode 134 to cathode 138. This further reduces capacitance. In this configuration, a multi-terminal diode device 130 implementing the present invention is provided, with the anode 134 and the shields 136 forming the multi-terminal diode, such as a three-terminal diode.

Figure 11A:
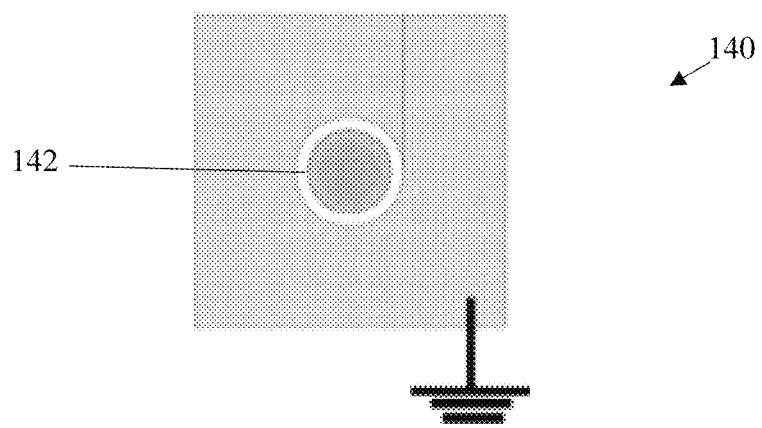
FIGS. 11A-11B show a top-view layout of the embodiments of the present invention with the shield grounded.

FIG. 11A shows a top view of a shielded PIN diode 140 with a central anode 142 as in the present invention, such as shown in FIG. 10, which exhibits a simulated capacitance of 3.4 fF, an anode-to-shield capacitance of 8.3 fF, and a cathode-to-shield capacitance of about 7 fF. This is compared to the unshielded PIN diode in the prior art, such as shown in FIG. 9, which may have a simulated capacitance of about 6.2 fF.

Figure 11B:
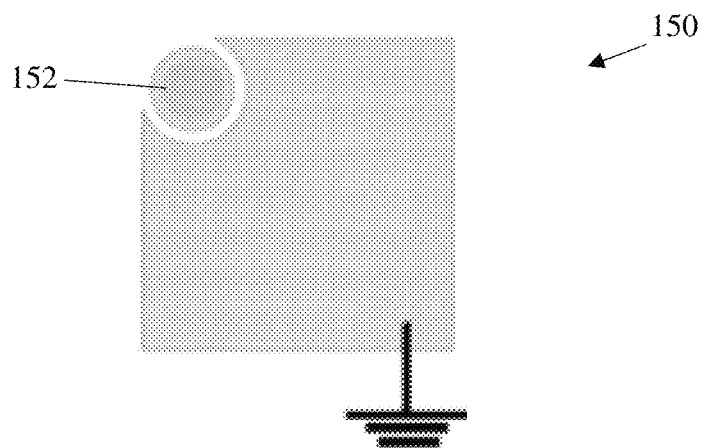

FIG. 11B shows a top view of a shielded PIN diode 150 with a corner anode 152 as in the present invention, such as shown in FIG. 6A. The shielded PIN diode 150 exhibits a simulated capacitance of about 2.9 fF, an anode-to-shield capacitance of 9.8 fF, and a cathode-to-shield capacitance of about 7.5 fF. This is compared to the unshielded PIN diode in the prior art, such as shown in FIG. 9, which may have a simulated capacitance of about 4.7 fF.

Figure 12A:
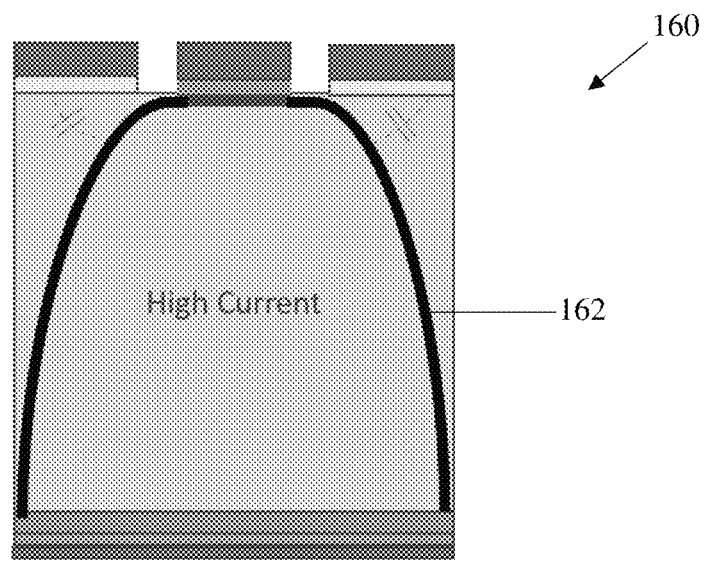
FIG. 12A shows an illustration of the shield-to-anode coupling impedance at high DC currents.
Figure 12B:
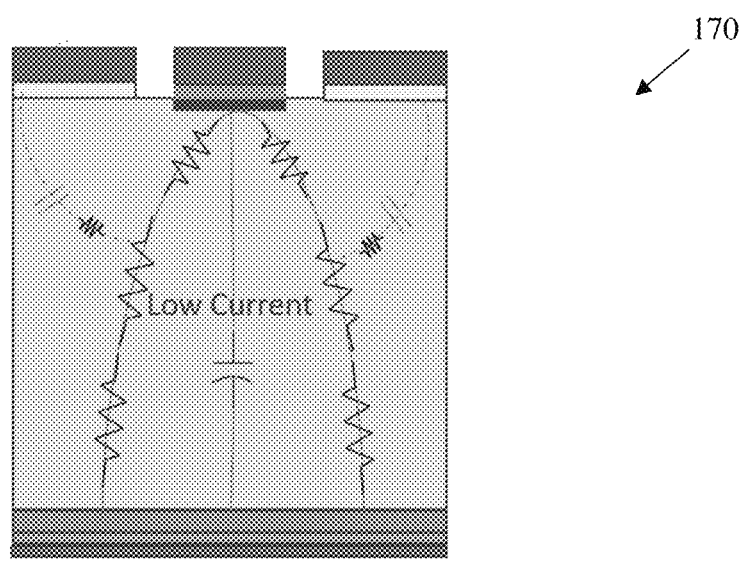
FIG. 12B illustrates the shield-to-anode impedance at low DC currents.

The electrostatic shield model analogy applies for operation with no DC current or very low anode-cathode currents. While substantially reducing the static capacitance from anode to cathode, the anode-to-shield coupling especially at high diode currents will limit the performance of the shield. FIGS. 12A and 12B represent a simple model for the shield coupling. FIG. 12A represents the case with high anode-to-cathode current, and hence a low cathode-to-anode resistance. For the PIN diode model 160 in FIG. 12A, the large electron concentration 162 in this case can be thought of as a conducting cone-shape-like plate to terminate the shield electrostatic field lines and hence the capacitance. If the shield were to be directly grounded the effective loading would be disastrous to the circuits of FIG. 4 and FIG. 5. FIG. 12B represents the case where the anode-to-cathode current is low, such as in the µA range. In the PIN diode model 170 in FIG. 12B, the series resistance and the spreading resistance are large and the cone is reduced in size, thereby dramatically reducing the shield-to-anode conductance. In the case of low current operation, a grounded shield will work as an effective way to reduce the anode-to-cathode capacitance and improve the isolation.

FIG. 13A illustrates another embodiment of the present invention, with a PIN diode 180 having an anode 182 surrounded by a shield 184, and using a simple circuit 186 which can equalize the deleterious effects of directly grounding the shield 184 at high currents. Since the shield 184 is only needed to improve the "OFF" isolation, or the isolation at low DC currents, a high impedance (Z) 188 can be used to shunt the feedthrough of anode to cathode. In the case of the "OFF" state or low currents, the shield-to-anode capacitance is only on the order of 10's to 100's of fF, so a small capacitance of, for example, about 0.5 pF can be used. The impedance 188 can be any combination of R-L-C's, but the simplest is a small capacitance to GND.

Larger capacitances will improve the anode-to-cathode isolation at the expense of smaller impedances between the shield and the anode. FIG. 13B shows another embodiment of the present invention having a switch 190 which can be used to switch in the impedance 188 only when the PIN diode 180 is in the "OFF" state or in a high resistance state for the circuits of FIG. 4 or FIG. 5. The switch 190 may be any known device, such as an external device, capable of acting as a switch.

Reduction of the Present Invention to Practice

PIN diodes using the present inventions have be fabricated and measured. The PIN diodes described herein were fabricated on about 5000 Ω-cm <100> float zone Si substrates. The die dimensions are W=L=about 330 µm, the "i" region thickness is about 325 µm, and the anode diameter is about 60 µm. The anode, cathode and shield metallization used were about 1 µm thick Al. A $SiO_2$ oxide thickness of about 600 angstroms (Å) is used under the shield metal. FIG. 14 shows a measurement of the AC anode-to-cathode resistance (RX). At 1 mA, RX is about 350Ω, and at 0.1 mA RX is about 3500Ω. This AC resistance is consistent with an "i" region carrier lifetime T of about 1.5 µsec.

FIG. 15 shows a Smith chart of an S11 measurement from anode to shield with the PIN diode of the present invention biased at about 2 mA. From FIG. 15, it can be seen that the capacitance at about 50 MHz is about 34 pF. The same PIN diode device was connected as a series resistor biased at about 1 mA of DC current. As shown in FIG. 16A, the through-loss is about 13.1 dB corresponding to a series resistance of about 350 ohms. In FIG. 16A, it can be seen that the shield is floating and looks normal. FIG. 16B shows the effect of the shield being grounded. Because of the large anode-to-shield-to-ground capacitance, the RF signal is greatly attenuated.

FIG. 17 shows a Smith chart of a measurement of the anode-to-shield impedance (S11) with the shield grounded at a much lower diode DC current of about 10 µA. The capacitance at 50 MHz drops by almost a factor of 30 to about 1.4 pF, and at 100's fF at 2 GHz. As shown in FIG. 18, using the PIN diodes of the present invention shown in FIGS. 13A-13B and adjusting the DC current to about 40 µA, the resulting through-loss is about –36 dB corresponding to a series resistance of about 6.3 Kohms. The frequency response is now almost flat from about 10 MHz to about 2 GHz with a slight up-tilt in loss. The best fit equivalent circuit shown in the inset 200 in FIG. 18 is a capacitance of about 3.4 fF parallel to a resistance of about 6.3 Kohms. The addition of the shunt of 0.5 pF in FIG. 13B has limited the maximum capacitance seen at the input of the anode to GND as about 0.5 pF, while at higher frequencies the maximum capacitance falls to 10's of fF.

Finally, FIG. 19 shows the through-loss measurement of a center anode PIN diode in the prior art with no shield, as shown in FIG. 6B, adjusted to the same current of about 40 µA and resulting with a loss resistance of about 6.3 Kohms. The loss is reduced to –30 dB at 2 GHz. This clearly shows worse isolation from anode to cathode, such as about 6 dB, for the prior art PIN diode of FIG. 6B. The inset 210 to FIG. 19 shows the best fit components of a resistance of about 6.3 Kohms in parallel with a capacitance of about 24 fF. The capacitance has increased from about 3.4 fF in the case of the equivalent circuit in FIG. 18 for the PIN diode of the present invention with a center shielded anode, to about 24 fF for the non-shield PIN diode in the prior art.

The present invention may be embodied in other specific forms without departing from its spirit or essential characteristics. The described embodiments are to be considered in all respects only as illustrative and not restrictive. The scope of the invention, therefore, will be indicated by claims rather than by the foregoing description. All changes, which come within the meaning and range of equivalency of the claims, are to be embraced within their scope.

What is claimed is:

1. A shielded PIN diode comprising:
    a substrate;
    a plurality of terminals including a first terminal composed of an aluminum layer, an ohmic metal layer, and a p+ implant layer, with the p+ implant layer contacting a first surface of the substrate;
    a second terminal composed of an aluminum layer, an ohmic metal layer, and a n+ implant layer, with the n+ implant layer contacting a second surface of the substrate opposite to the first surface;
    at least one third terminal on the first surface operating as a shield, with the first terminal acting as an anode, and the second terminal acting as a cathode, wherein the substrate is connected to the plurality of terminals at the p+ implant layer and at the n+ implant layer; and
    an insulating layer disposed between the top surface of the substrate and the at least one third terminal wherein the second terminal and the at least one third terminal are connected to a ground; and
    wherein the top surface has a central area; and wherein the anode is disposed in the central area.

2. The shielded PIN diode of claim 1, wherein the top surface has a substantially rectangular shape.

3. The shielded PIN diode of claim 1, wherein the top surface has a substantially circular shape.

4. The shielded PIN diode of claim 1, wherein the insulating layer is composed of $SiO_2$.

5. The shielded PIN diode of claim 1, wherein the at least one third terminal includes a layer implanted with one of a P+ implant or a P− implant.

6. The shielded PIN diode of claim 5, wherein the insulating layer is composed of $SiO_2$.

7. The shielded PIN diode of claim 1, wherein the at least one third terminal is connected to an impedance which is connected to the ground, thereby reducing feedthrough for a low current state or an OFF state.

8. The shielded PIN diode of claim 7, wherein the ground is one of an alternating current (AC) ground or a direct current (DC) ground.

9. The shielded PIN diode of claim 7, wherein the impedance is connected to the ground through a switch, thereby allowing high isolation in the OFF state, and providing relatively small capacitance between the anode and the at least one third terminal.

10. A shielded PIN diode comprising:
    a substrate having a top surface;
    a first terminal acting as an anode, with the first terminal composed of an aluminum layer, an ohmic metal layer, and a p+ implant layer, with the p+ implant layer contacting a first surface of the substrate;
    a second terminal acting as a cathode, with the second terminal composed of an aluminum layer, an ohmic metal layer, and a n+ implant layer, with the n+ implant layer contacting a second surface of the substrate opposite to the first;
    at least one third terminal on the first surface connected to a ground operating as a shield, thereby reducing fringing capacitance between the anode and the cathode; and
    an insulating layer disposed between the top surface of the substrate and the at least one third terminal;
    wherein the second terminal is connected to ground; and
    wherein the top surface has a central area; and wherein the anode is disposed in the central area.

11. The shielded PIN diode of claim 10, wherein the insulating layer is composed of $SiO_2$.

12. The shielded PIN diode of claim 10, wherein the at least one third terminal includes a layer implanted with one of a P+ implant or a P− implant.

13. The shielded PIN diode of claim 12, wherein the insulating layer is composed of $SiO_2$.

14. The shielded PIN diode of claim 10, wherein the at least one third terminal is connected to an impedance which is connected to the ground, thereby reducing feedthrough for a low current state or an OFF state.

15. The shielded PIN diode of claim 14, wherein the ground is one of an alternating current (AC) ground or a direct current (DC) ground.

16. The shielded PIN diode of claim 14, wherein the impedance is connected to the ground through a switch, thereby allowing high isolation in the OFF state, and providing relatively small capacitance between the anode and the at least one third terminal.

* * * * *